(12) United States Patent
Yasuda

(10) Patent No.: US 7,795,920 B2
(45) Date of Patent: Sep. 14, 2010

(54) SEMICONDUCTOR INTEGRATED CIRCUIT

(75) Inventor: Shinichi Yasuda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 12/367,379

(22) Filed: Feb. 6, 2009

(65) Prior Publication Data

US 2009/0249141 A1 Oct. 1, 2009

(30) Foreign Application Priority Data

Mar. 31, 2008 (JP) ............................. 2008-089735
Mar. 31, 2008 (JP) ............................. 2008-090166

(51) Int. Cl.
*H03K 19/00* (2006.01)
(52) U.S. Cl. ..................... 326/93; 326/46; 713/503; 714/700
(58) Field of Classification Search ............ 326/26–28, 326/38, 46, 93–98; 714/700, 714; 713/503
See application file for complete search history.

(56) References Cited

U.S. PATENT DOCUMENTS

| | | | |
|---|---|---|---|
| 2004/0199821 A1 | 10/2004 | Flautner et al. | |
| 2004/0243893 A1 | 12/2004 | Mudge et al. | |
| 2005/0005214 A1* | 1/2005 | Ueda | 714/726 |
| 2005/0246613 A1 | 11/2005 | Blaauw et al. | |
| 2007/0255974 A1* | 11/2007 | Gilday et al. | 713/503 |
| 2008/0129357 A1* | 6/2008 | Chlipala et al. | 327/161 |
| 2008/0315930 A1* | 12/2008 | Gomm | 327/175 |
| 2009/0282279 A1* | 11/2009 | Nakamura | 713/400 |

OTHER PUBLICATIONS

Blaauw, D. et al., "Razor II: In Situ Error Detection and Correction for PVT and SER Tolerance," ISSCC 2008, Session 22, Variation Compensation & Measurement, 22.1, IEEE International Solid-State Circuits Conference, pp. 400-401 and 622, (2008).
Austin, T. et al., "Making Typical Silicon Matter with Razor," IEEE Computer Society, pp. 57-65, (Mar. 2004).
Yasuda, S. et al., "Semiconductor Integrated Circuit Apparatus," U.S. Appl. No. 11/859,878, filed Sep. 24, 2007.

* cited by examiner

*Primary Examiner*—Don P Le
(74) *Attorney, Agent, or Firm*—Finnegan, Henderson, Farabow, Garrett & Dunner, L.L.P.

(57) ABSTRACT

A semiconductor integrated circuit includes a flipflop holding and outputting input data according to a clock, the flipflop having: an input end to which data is input; an output end from which data is output; a first logic gate connected between the input end and the output end, the first logic gate operating according to the clock; a second logic gate connected between the first logic gate and the output end, the second logic gate operating according to the clock; and a buffer circuit. An input of the buffer circuit is connected to a node between the first logic gate and the input end. An output of the buffer circuit is connected to a node in an output side of the first logic gate. The buffer circuit transitions according to an enable signal from a high impedance state to a state in which a signal can be transmitted.

20 Claims, 9 Drawing Sheets

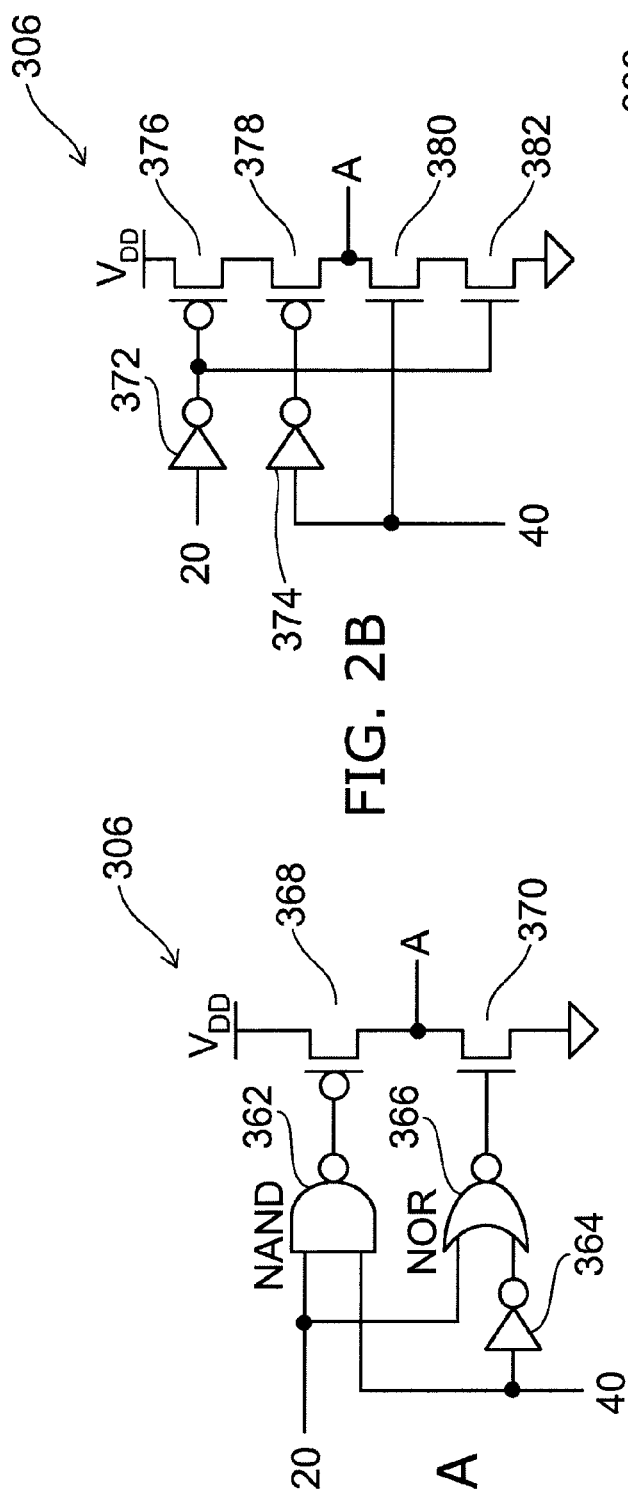
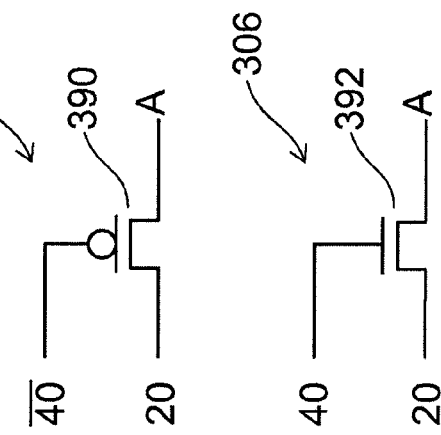
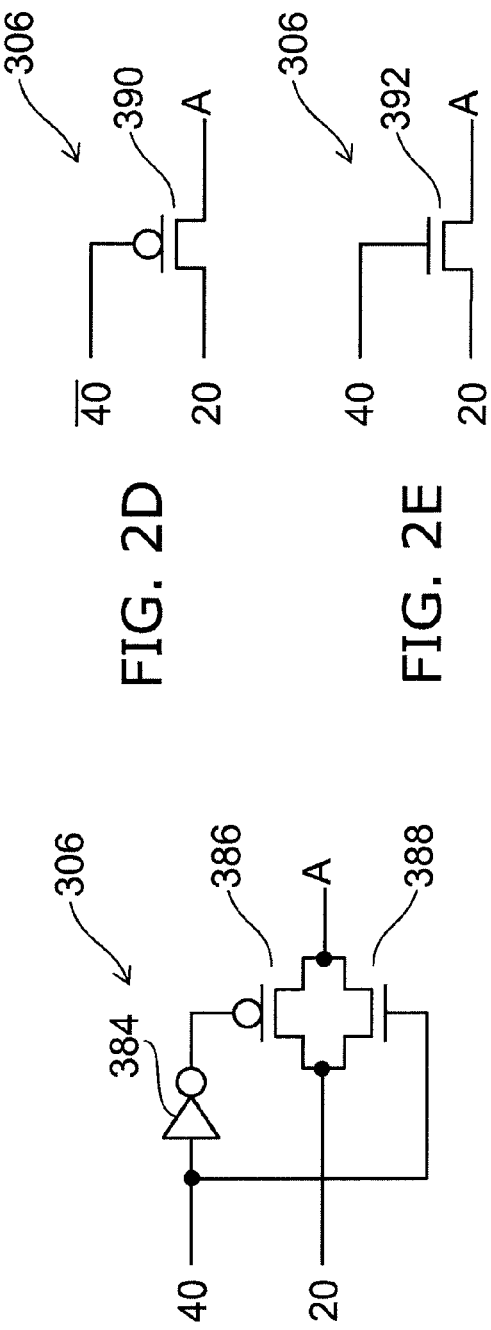

US 7,795,920 B2

SEMICONDUCTOR INTEGRATED CIRCUIT

CROSS-REFERENCE TO RELATED APPLICATIONS

This application is based upon and claims the benefit of priority from the prior Japanese Patent Application No. 2008-089735, filed on Mar. 31, 2008; the entire contents of which are incorporated herein by reference.

BACKGROUND OF THE INVENTION

1. Field of the Invention

This invention relates to a semiconductor integrated circuit, and more specifically, to a semiconductor integrated circuit being capable of detecting timing error.

2. Background Art

As integration degree of semiconductor integrated circuits is enhanced and sizes of semiconductor elements composing the integrated circuits become small, production variation of the elements becomes large. As the variation becomes large, a circuit block whose operation is slow comes to exist in certain probability, and there is a problem that timing error is caused by too late operation of the circuit for the clock frequency. If the clock frequency is reduced for avoiding this, it becomes difficult to satisfy the required operation speed. Moreover, as the integrated degree becomes high, it becomes difficult to wire the clock with equal delay to a plurality of circuits on the chip, and noise becomes easy to mix in the power voltage. As a result, circuits causing timing error with a little variation are increased and there is a problem of yield lowering.

Conventionally, as a technique for avoiding timing error and soft error, such a method as described as US-A 2004/0199821 is known in a flipflop circuit holding data according to the clock signal. In this method, another latch circuit is provided in parallel to the flipflop on the pipeline and is used by a slightly delayed clock than the system clock to compare data contents held by both of the circuits, and if the data contents are different, it is determined that there is error and the data is calibrated.

However, in this method, one more latch circuit is required, and also, a comparison circuit for comparing data and a calibration circuit for calibrating data, and therefore, the scale of the circuits becomes large.

SUMMARY OF THE INVENTION

According to an aspect of the invention, there is provided a semiconductor integrated circuit including a flipflop holding and outputting input data according to a clock, the flipflop having: an input end to which data is input; an output end from which data is output; a first logic gate connected between the input end and the output end, the first logic gate operating according to the clock; a second logic gate connected between the first logic gate and the output end, the second logic gate operating according to the clock; and a buffer circuit, an input of the buffer circuit being connected to a node between the first logic gate and the input end, an output of the buffer circuit being connected to a node in an output side of the first logic gate, and the buffer circuit transitioning according to an enable signal from a high impedance state to a state in which a signal can be transmitted.

According to another aspect of the invention, there is provided a semiconductor integrated circuit including a flipflop holding and outputting input data according to a clock, the flipflop including: a first latch circuit connected to an input of the flipflop and having a logic gate which operates according to the clock; a second latch circuit connected between the first latch circuit and an output of the flipflop; and a buffer circuit, an input of the buffer circuit being connected to a node in an input side of the logic gate, an output of the buffer circuit being connected to a node in an output side of the logic gate, and the buffer circuit transitioning according to an enable signal from a high impedance state to a state in which a signal can be transmitted.

BRIEF DESCRIPTION OF THE DRAWINGS

FIGS. 2A to 2E are schematic views showing a specific example of the buffer circuit 306;

DETAILED DESCRIPTION OF THE INVENTION

According to an embodiment of this invention, a buffer circuit controlled by an enable signal supplied from the outside is attached to a flipflop circuit provided in the semiconductor integrated circuits. If a circuit that cannot satisfy timing by variation exists, the data is calibrated in the flipflop circuit by supplying the enable signal, and the data is calibrated so as to satisfy the request of the operation speed even after the production thereof. Thereby, the chip yield is improved.

Hereinafter, the embodiment of this invention will be explained with reference to drawings. In each of the figures, the same signs are appended to the same components as shown in a previously presented figure and detailed explanation thereof will be appropriately omitted.

Figure 1:
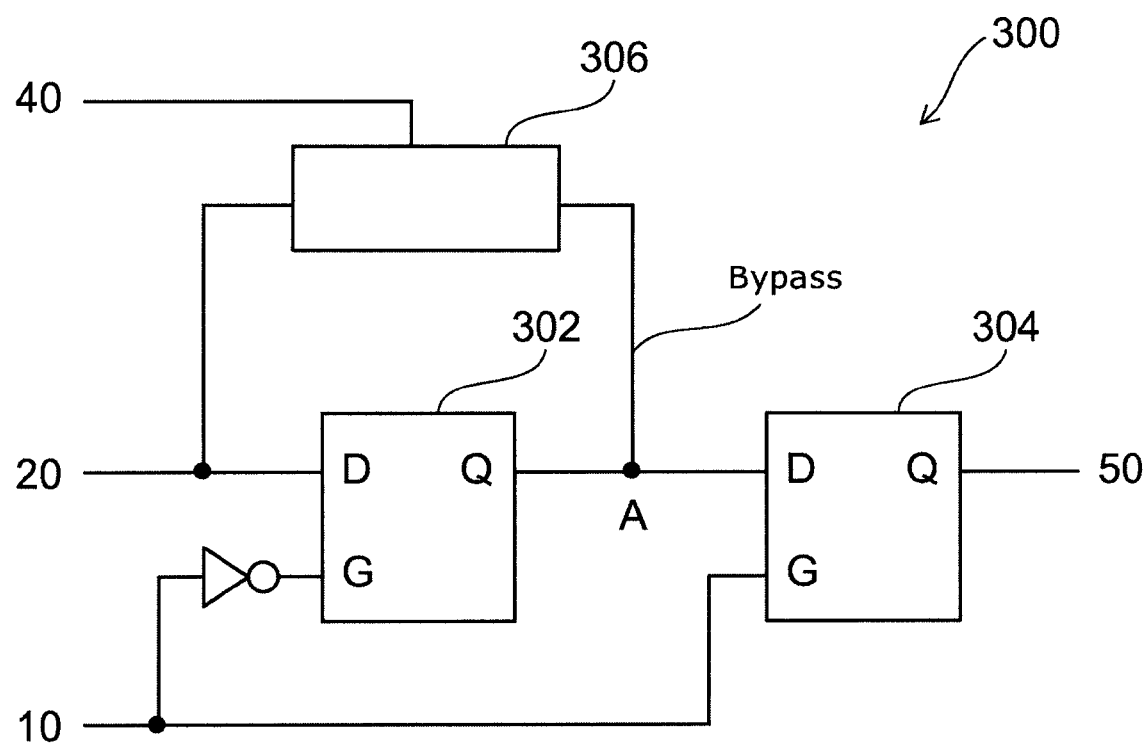
FIG. 1 is a block diagram showing a flipflop 300 with correction function provided in a semiconductor device according to an embodiment of this invention.

FIG. 1 is a block diagram showing a flipflop 300 with correction function provided in a semiconductor device according to an embodiment of this invention.

The flipflop 300 with correction function shown in FIG. 1 has a D-type flipflop composed of a master latch (first latch circuit) 302 and a slave latch (second latch circuit) 304. And, a buffer circuit 306 is connected in parallel with the master latch 302. The buffer circuit 306 operates by an enable signal 40. In FIG. 1, a D-type flipflop structure operating at a rising edge is illustrated, and the following explanation will be advanced along the structure but a D-type flipflop operating at a negative-going edge can be used in the same manner.

The buffer circuit 306 is a circuit switching between a state of high impedance and a state in which a signal can be passed therethrough by the enable signal 40. That is, the buffer circuit 306 bypasses the master latch 302 to transmit an input 20 to a node A by the enable signal 40.

FIG. 2 is a schematic view showing a specific example of the buffer circuit 306.

As the buffer circuit 306, a three-state buffer circuit can be used as shown in FIG. 2A. That is, the buffer circuit 306 shown in FIG. 2A has an NAND 362, an inverter 364, an NOR 366, a PMOS transistor 368, and an NMOS transistor 370. Each of the input 20 and the enable signal 40 is input into the NAND 362, and the output of the NAND 362 controls the gate of the PMOS transistor 368. On the other hand, an inversion signal of the enable signal 40 and the input 20 are input into the NOR 366 and the output of the NOR 366 controls the gate of the NMOS transistor 370. The PMOS transistor and the NMOS transistor 370 are serially connected in this order between power VDD and ground, and a signal is output from the connection midpoint thereof to the node A.

According to the three-state buffer structure as shown in FIG. 2A, the output A becomes in a high impedance state when the enable signal 40 is Low, and the output A transitions to the same level as the input 20 when the enable signal 40 is High.

FIG. 2B is a schematic view showing a second specific example of the buffer circuit 306.

This example is a combination of an inverter circuit and a three-state inverter circuit.

That is, the input 20 controls the gates of a PMOS transistor 376 and an NMOS transistor 382 through an inverter 372. On the other hand, the enable signal 40 controls the gate of a PMOS transistor 378 through an inverter 374. Moreover, the enable signal 40 controls the gate of an NMOS transistor 380 as it is.

The PMOS transistor 376, the PMOS transistor 378, the NMOS transistor 380, and the NMOS transistor 382 are serially connected in this order between power VDD and ground. And, a signal is output from the connection midpoint between the PMOS transistor 378 and the NMOS transistor 380 to the node A.

Also, in the circuit shown in FIG. 2B, the output A becomes in a high impedance state when the enable signal 40 is Low, and the output A transitions to the same level as the input 20 when the enable signal 40 is High.

FIG. 2C is a schematic view showing a third specific example of the buffer circuit 306.

This specific example is a transmission gate structure.

That is, a PMOS transistor 386 and an NMOS transistor 388 are connected in parallel between the input 20 and the node A. And, an inversion signal of the enable signal 40 controls the PMOS transistor 386, and on the other hand, the enable signal 40 controls the gate of the NMOS transistor 388.

Also, in the circuit shown in FIG. 2C, the output A becomes in a high impedance state when the enable signal 40 is Low, and the output A transitions to the same level as the input 20 when the enable signal 40 is High.

FIG. 2D is a schematic view showing a fourth specific example of the buffer circuit 306.

In this specific example, a PMOS transistor 390 is provided between the input 20 and the node A, and the gate thereof is controlled by the inversion signal of the enable signal 40.

FIG. 2E is a schematic view showing a fifth specific example of the buffer circuit 306.

In this specific example, an NMOS transistor 392 is provided between the input 20 and the node A, and the gate thereof is controlled by the enable signal 40.

Also, in both of the specific examples, the output A becomes in a high impedance state when the enable signal 40 is Low, and the output A transitions to the same level as the input 20 when the enable signal 40 is High.

The explanation will be continued with returning to FIG. 1 again.

As described above, the buffer circuit 306 becomes active when the enable signal 40 is High, and becomes in a high impedance state when the enable signal 40 is Low. The operation of flipflop 300 with correction function shown in FIG. 1 is as follows.

First, when correct data reach the input 20 after the rising of the clock, the enable signal 40 is set to High and the data is passed to the input of the slave latch 304, and then, the enable signal 40 is set to Low.

Here, the enable signal 40 may be generated so that delayed arrival of the correct data than that of the clock 10 serves as the trigger, or the method of synchronizing the enable signal 40 with the clock 10 to constantly transmit the enable signal 40 in a predetermined period after rising of the clock 10. As the method of determining whether the correct data reach the input 20 more slowly than the clock 10, there is, for example, a method of monitoring the input and the output of the flipflop.

Figure 3:
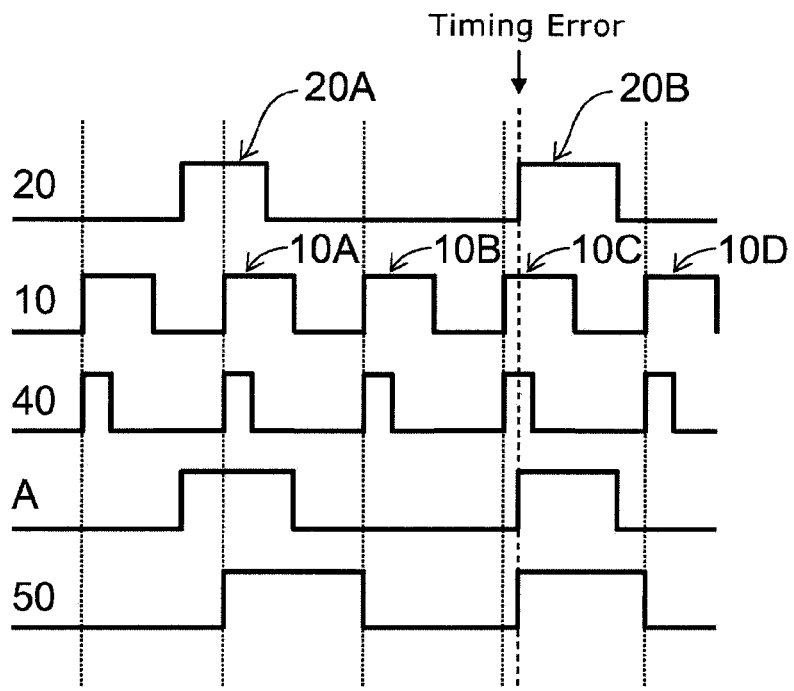
FIG. 3 is a timing chart illustrating operation of the flipflop 300 with correction function shown in FIG. 1.

FIG. 3 is a timing chart illustrating operation of the flipflop 300 with correction function shown in FIG. 1.

Here, the case in which the enable signal 40 is constantly High only in a predetermined period after rising of the clock 10 has is shown.

When the input signal 20A arrives prior to the clock 10A, the data of the input signal 20A is latched and the output signal 50 rises to be High, simultaneously with rising of the clock 10A. Then, if the data is changed to be the next data after the enable signal 40 negatively goes in the design, the operation becomes the same as a general flipflop. That is, the output 50 rising in the clock 10A is maintained as it is. And, when the next rising of the clock 10B, the input 20 has transitioned to Low, and therefore, the output 50 also transitions to Low.

Here, when each of the circuits on the semiconductor integrated circuits is correctly produced and data (input 20) arrive before the clock 10 in all the cases, the enable signal 40 is not required to be used. However, in the circuits having a case in which data come to arrive after the clock 10C due to variation or the like as the input signal 20B, the enable signal 40 is supplied to calibrate the data. When such timing error is caused, if the enable signal 40 is High, correction data is output in a slightly delayed timing.

That is, in the time point that the clock 10C rises, the data still does not arrive and the input 20 remains Low, and therefore, the output 50 does not rise and remains Low. Then, when the data 20B arrives out of time, enable signal 40 is High, and therefore, the output 50 rises to High according to rising of the data 20B. Then, the enable signal 40 negatively goes but the output remains latched to be High. And, when the next clock 10D rises, the input has transitioned to be Low and therefore the output 50 also transitions to Low.

As described above, even when the data 20B arrived more slowly than clock 10C, the data can be reflected and calibrated by the enable signal 40.

Here, in outputting the delayed data 20B, its timing is slightly delayed more than the clock and therefore it is desirable to make consideration for the timing of the next stage. However, when the delay time for the next stage is relatively short, the timing can be absorbed. If the timing error is also caused at the next stage too, the same measures as this embodiment is also performed at the next flipflop and thereby the data can be calibrated. Alternatively, the handling can be performed by preliminarily shortening the delay time of the logic of the next stage.

Figure 4:
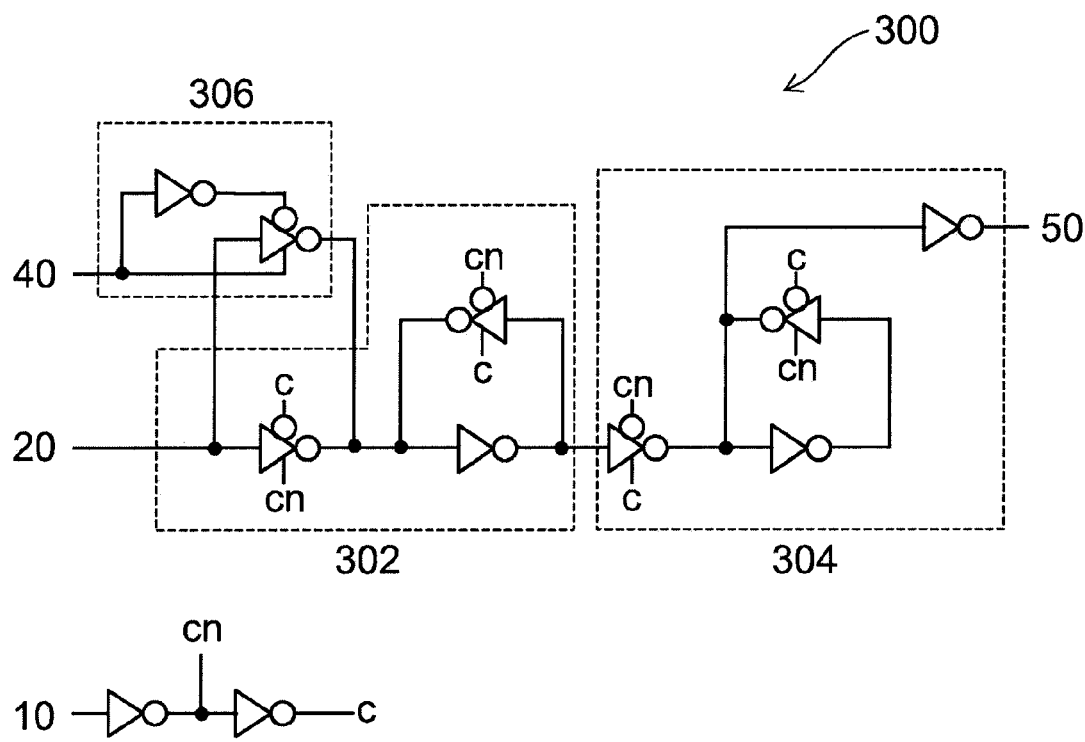
FIG. 4 is a block diagram showing a second specific example of the flipflop 300 with correction function provided in a semiconductor device.

FIG. 4 is a block diagram showing a second specific example of the flipflop 300 with correction function provided in a semiconductor device according to an embodiment of this invention.

The flipflop 300 with correction function of this example also has a D-type flipflop composed of the master latch 302 and the slave latch 304. And, the output of the buffer circuit 306 is not connected to the input of the slave latch 304 but connected to the output of the three-state inverter that is inside node of the master latch 302. In this specific example, the three-state inverter is used for the buffer circuit 306 but the circuit is not limited thereto as long as having the same functions and logic inversion. Thereby, the number of transistors of the buffer circuit 306 can be reduced, and the circuit area can be small.

Moreover, here, the D-type flipflop having the smallest functions of only the clock 10, the input 20, and the output 50 is exemplified, but the flipflop having larger functions with a set terminal or a reset terminal can be used in the same method. Moreover, when the widths of the transistors composing the three-state inverter of the buffer circuit 306 are small, the gate capacity driving the logic circuit connected to the input 20 of the flipflop 300 with correction function is reduced, and the operation speed of the logic circuit is not degraded. Moreover, when the widths of the transistors of the buffer circuit 306 are equal to or larger than the widths of transistors composing the three-state inverter used in the feedback loop in the master latch 302, the calibration operation in the flipflop can be quickly performed. The widths of transistors of the buffer circuit 306 may be determined considering such trade-off as described above.

Figure 5:
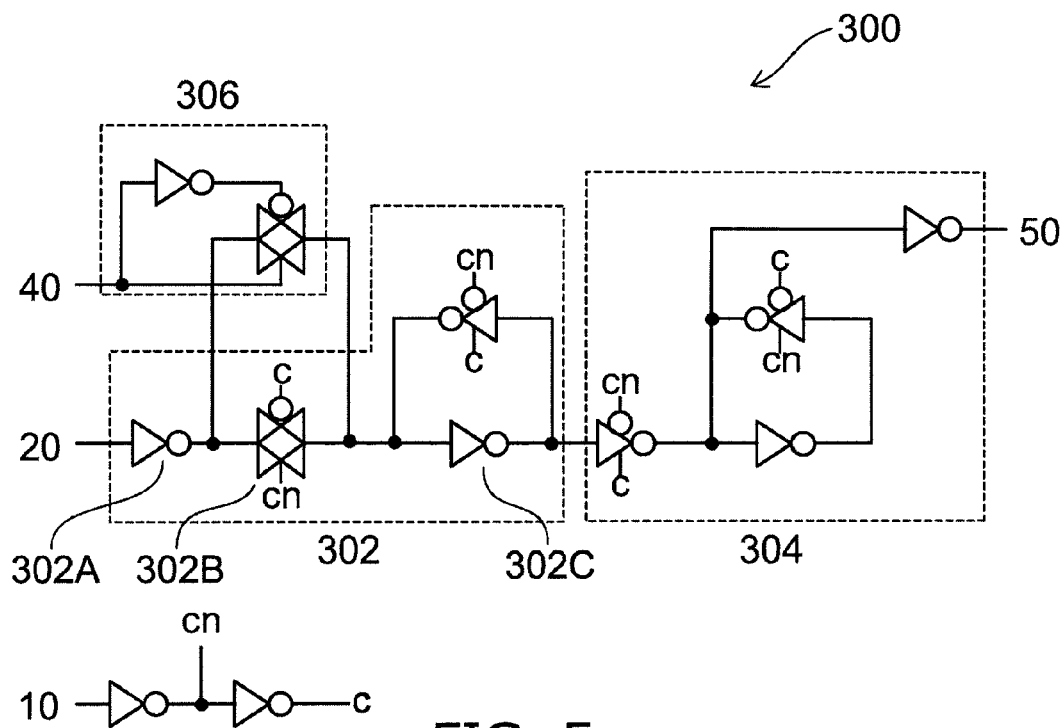
FIG. 5 is a schematic view showing a third example of the flipflop 300 with correction function.

FIG. 5 is a schematic view showing a third example of the flipflop 300 with correction function.

The flipflop 300 with correction function of this specific example has D-type flipflop composed of the master latch 302 and the slave latch 304. And, the three-state inverter of the input of the master latch 302 is divided into an inverter 302A and a transmission gate 302B, and the buffer circuit 306 is connected before and after the transmission gate 302B.

Also, in this specific example, when the enable signal 40 becomes high, the calculation output 20 that is more delayed than the clock 10 is taken inside and the error can be calibrated. Moreover, in this specific example, a transmission gate is used as the buffer circuit 306 but the circuit is not limited thereto as long as having the same function and no inversion of logic. Thereby, the number of transistors of the buffer circuit 306 can be reduced, and the circuit area can be small. Moreover, the input terminal of the flipflop 300 with correction function and the buffer circuit 306 are separated, and therefore, it is not necessary to consider the buffer circuit 306 in the design of the logic circuit connected to the input terminal of the flipflop 300 with correction function.

Also, in this specific example, these are possible for the flipflop having a larger number of functions. That is, in this specific example, the D-type flipflop having the smallest functions of only the clock 10, the input 20, and the output 50 is exemplified, but the flipflop having larger functions with a set terminal or a reset terminal can be used in the same method.

Moreover, in this specific example, when the widths of the transistors composing the transmission gate of the buffer circuit 306 are small, the source-drain capacity can be reduced.

As explained for the first to third specific examples, there are a large number of combinations of transistors composing the operation of the flipflop 300 with correction function, and the combinations are not limited thereto. Moreover, when the buffer circuit 306 is used for the flipflop having a different structure from the above-described specific examples in the same method, the data can be calibrated when necessary. That is, for the logic gate that is located near the input terminal of the data output from the logic circuit and that operates according to the clock 10, the buffer circuit is connected so as to have the node before the logic gate as the input and to have the node after the logic gate as the output, and thereby, the operation state or the high impedance state can be selected by the enable signal 40, and therefore, the data calibration can be performed.

Figure 6:
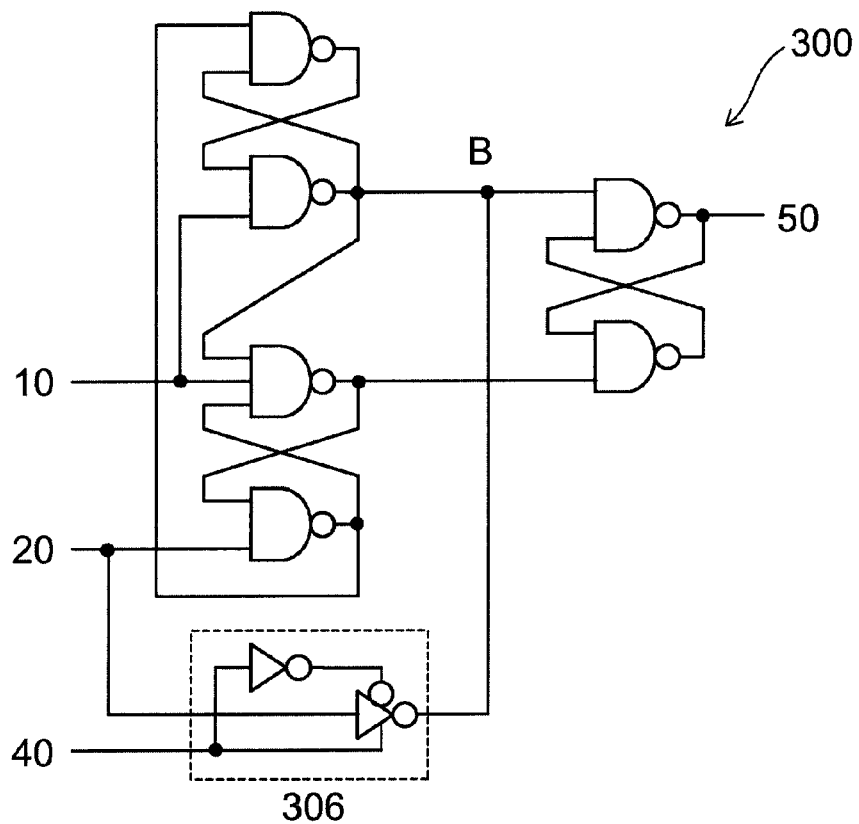
FIG. 6 is a schematic view showing a fourth specific example of the flipflop 300.

FIG. 6 is a schematic view showing a fourth specific example of the flipflop 300.

This example is provided with a circuit in which a edge-trigger-type flipflop is realized by NAND gate, and has a structure in which the buffer circuit 306 is connected between the input 20 and the node B. Also, in this specific example, in the rising edge of the clock 10, the data of the input 20 is latched and the data is output to the output 50. And, when the enable signal 40 becomes High, the calculation output 20 delayed more than clock 10 is taken inside and the error can be calibrated.

In this specific example, the three-state inverter is used as the buffer circuit 306 but the circuit is not limited thereto as long as having the same functions and logic inversion. When the widths of the translators of the three-state inverter are larger than that of the NAND gate, stable and high-speed operation becomes possible.

If the transistor size of the three-state inverter composing the buffer circuit 306 becomes large, the load of the logic circuit connected to the input 20 can be large. Thereby, if the operation of the logic circuit becomes slow, this can be avoided by inserting a buffer, which is not shown, between the input and the buffer circuit 306.

Also, in such a flipflop circuit of different type as this specific example, for the logic gate that is located most closely to the input terminal of the data output from the logic circuit and that operates according to the clock 10, the buffer circuit 306 is connected so as to have the node before the logic gate as the input and to have the node after the logic gate as the output, and thereby, the operation state or the high impedance state can be selected by the enable signal 40, and therefore, the flipflop in which the data can be calibrated can be realized.

As described above, the flipflop 300 with correction function according to first to fourth specific examples has been explained. Next, a method for generating an enable signal 40 output to the flipflop 300 with correction function will be explained with reference to a specific example.

Figure 7:
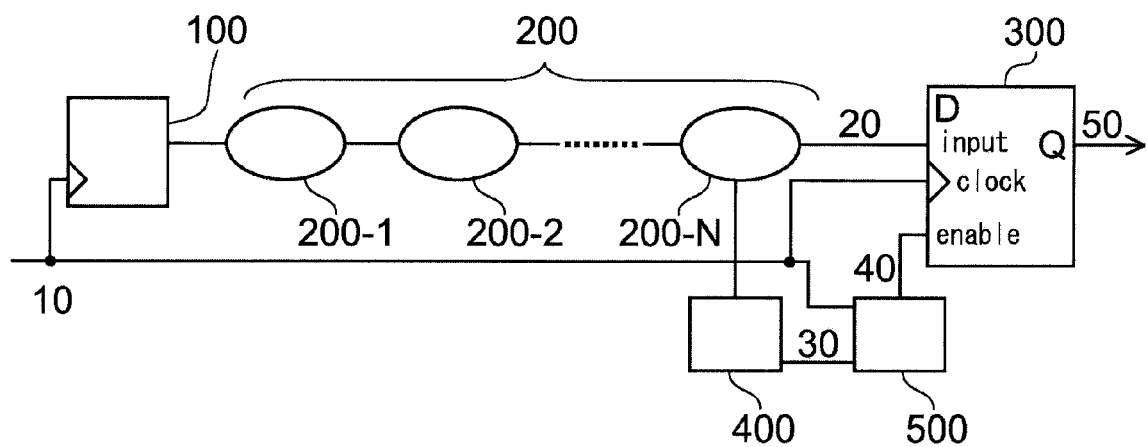
FIG. 7 is a block diagram showing the substantial part of the semiconductor integrated circuits according to an embodiment of this invention.

FIG. 7 is a block diagram showing the substantial part of the semiconductor integrated circuits according to an embodiment of this invention.

Figure 8:
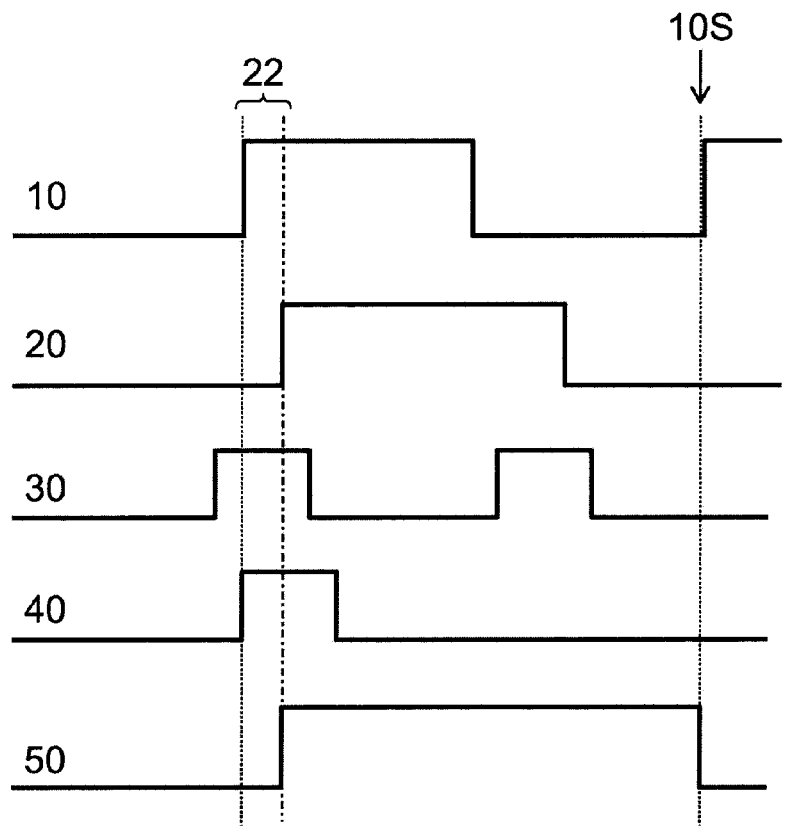
FIG. 8 is a timing chart showing an example of operation of the semiconductor integrated circuit of this embodiment.

Moreover, FIG. 8 is a timing chart showing an example of operation of the semiconductor integrated circuit of this embodiment.

The semiconductor integrated circuit of this embodiment has a flipflop 100, combinatorial logic circuits 200, a flipflop 300 with correction function, a signal transition detection circuit 400, and an enable signal generation circuit 500. The combinatorial logic circuits 200 are circuits realizing discretional logic with combining a plurality of logic circuits 200-1, 200-2 . . . 200-N. Each of the logic circuits 200-1, 200-2 . . . 200-N may be composed of one transistor or may be composed of one logic gate or may be composed of a plurality of logic gates.

The output of the flipflop 100 is input into the combinatorial logic circuits 200, and the calculation output 20 including the result of calculation in the combinatorial logic circuits 200 is input into the flipflop 300 with correction function. And, the signal transition detection circuit 400 is connected to the logic circuit 200-N including the last stage of the combinatorial logic circuits 200.

The signal transition detection circuit 400 detects whether the logic circuit 200-N operates or not. As the detection method, there are, for example, a method for using a domino circuit, and a method for detecting current flowing through the logic circuit 200-N as described later. When the logic circuit 200-N is operating, namely, while the signal transition is being measured, the signal transition detection circuit 400 outputs the detection signal 30 representing the operation, to the enable signal generation circuit 500.

The enable signal generation circuit 500 generates the enable signal 40 having a pulse width according to time from rising of the clock, namely, the clock edge to the disappearance of the detection signal 30 of the signal transition detection circuit 400 and outputs the enable signal 40 to the enable terminal (enable) of the flipflop 300 with correction function. The flipflop 300 with correction function has the structure described above for FIGS. 1 to 6, and operates the correction function while the enable signal 40 is ON (high level).

In this embodiment, the detection signal 30 is generated from the signal transition detection circuit 400 according to the signal transition, by the operation of the logic circuit 200-N immediately before the input of the flipflop 300 with a correction function. In the enable signal generation circuit 500, when the detection signal 30 is being generated from the signal transition detection circuit 400 in rising the clock 10, the enable signal 40 is synchronized with the signal and output. Based on the enable signal 40 output from the enable signal generation circuit 500, calibration operation of error is performed in the flipflop 300 with correction function, and the output 50 of the flipflop 300 with correction function is calibrated to the data delayed and arriving.

The specific example shown in FIG. 8 will be explained as follows.

The flipflop 100 provides a predetermined input signal to the combinatorial logic circuit 200 based on the clock 10. The combinatorial logic circuit 200 carries out predetermined calculation based on the input signal and outputs the calculation output 20 to the flipflop 300 with correction function. In this case, in the output signal 20 output from the combinatorial logic circuit 200, delay 22 is occasionally generated.

Here, in the period from initiation of logic calculation of the last-stage logic circuit 200-N to output of the calculation output 20 to the flipflop 300 with correction function, a predetermined operation current flows, for example, in the logic circuit 200-N. The signal transition detection circuit 400 detects the flow of current in the logic circuit 200-N and thereby the high-level detection signal 30 is output only while the logic circuit 200-N is operating. That is, in the period including the timing that the correct calculation output 20 is output from the combinatorial logic circuits 200 and before and after the timing, the high-level detection signal 30 is output.

The enable signal generation circuit 500 inputs the high-level detection signal 30 and outputs the high-level enable signal 40 during high level of the detection signal 30 and the clock 10. A little delay between the detection signal 30 and the enable signal 40 is occasionally generated, and as shown in FIG. 8, disagreement of the negative-going edges between the detection signal 30 and the enable signal 40 is occasionally caused.

When the high-level enable signal 40 is input, the flipflop 300 with correction function waits for the correction calculation output 20 sent from the combinatorial logic circuits 200. And, when the calculation output 20 is output from the combinatorial logic circuits 200, the output 50 is inverted based thereon. Then, the enable signal 40 is inverted to be at a low level but the flipflop 300 with correction function maintains the output 50 to the next clock edge 10S. And, in the specific example shown in FIG. 8, because the calculation output 20 is not at a high level at the next clock edge 10S, the output 50 of the flipflop 300 with correction function transitions to be at a low level.

As described above, according to this embodiment, the operation of the logic circuit 200-N including the last stage of the combinatorial logic circuits 200 is detected by the signal transition detection circuit 400, and in the period before or after the timing that the correction calculation output 20 is output, the enable signal 40 is sent to the flipflop 300 with correction function. The flipflop 300 with correction function waits for the correct calculation output 20 based on the enable signal 40 and inverts the output 50 when the calculation output 20 comes. Furthermore, then, after transition of the enable signal 40 to be at a low level, the output 50 is maintained to the next clock edge.

This indicates the timing that the correct calculation output 20 is output even when the calculation output 20 is delayed from the clock 10. And, the output 50 that the correct calculation output 20 input at the timing is reflected can be obtained.

In this specific example, when the correction function in the flipflop 300 with correction function is realized by the slightly delayed clock 10, the slightly delayed clock 10 is made to rise at the timing that the enable signal 40 disappears (becomes at a low level). Moreover, when the correction function of the flipflop 300 with correction function is synchronized with the clock and operates, even if the enable signal 40 is not generated by using the clock 10 by the enable signal generation circuit 500, the clock automatically rises in the flipflop 300 with correction function and the error calibration (correction function) is initiated. Therefore, in this case, the input of the clock 10 to the enable signal generation circuit 500 can be omitted.

In the specific example shown in FIG. 8, the respective signals are active in the High states, and the flipflop 300 with correction function operates at the rising edge, but this invention is not limited to these specific examples. That is, even if a part or all thereof is negative logic operation, the same operations can be realized. Actually, when the signal transition detection circuit is a current measurement circuit, the detection signal 30 is an analog signal, but for explaining the timing in the FIG. 8, the rectangle waves are conveniently shown.

Figure 9:
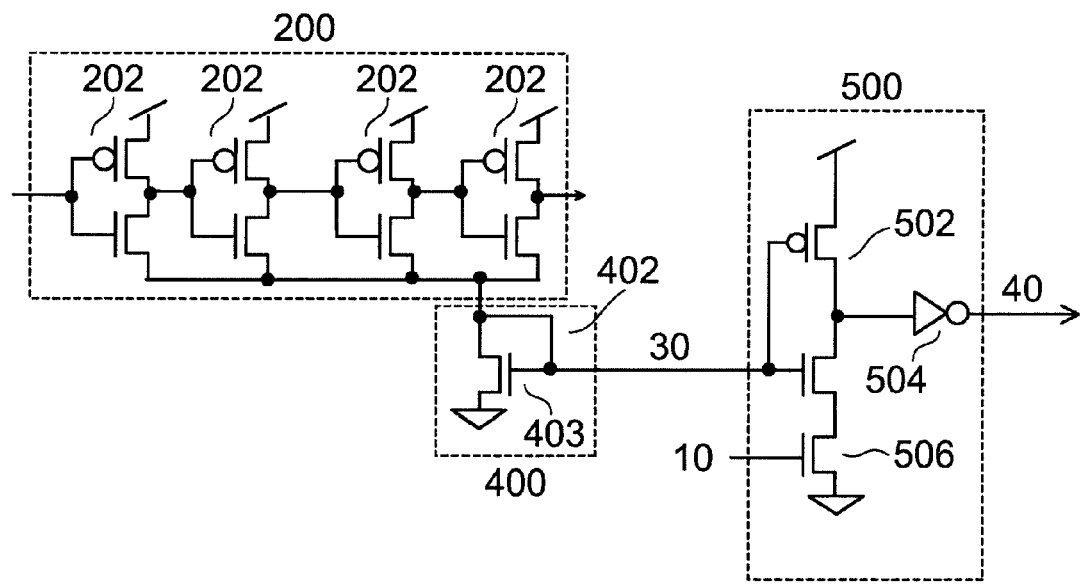
FIG. 9 is a schematic view showing a specific example of the combinatorial logic circuits 200, the signal transition detection circuit 400, and enable signal generation circuit 500.

FIG. 9 is a schematic view showing a specific example of the combinatorial logic circuits 200, the signal transition detection circuit 400, and enable signal generation circuit 500.

That is, FIG. 9 shows a specific example of forming the combinatorial logic circuits 200 by continuous CMOS (Complementary Metal-Oxide-Semiconductor) inverters 202. Here, in FIG. 9, a part of the last stage of the combinatorial logic circuits 200 is shown, and the combinatorial logic circuits 200 may have a circuit part, which is not shown. Moreover, in FIG. 9, the combinatorial logic circuits 200 are a serial inverter 202, but naturally, this invention can also be applied to a discretional circuit except therefor.

In this specific example, the signal transition detection circuit 400 is inserted between the ground terminal of the four-stage CMOS inverter 202 including the last stage of the combinatorial logic circuits 200 and the ground. The signal transition detection circuit 400 is an NMOS transistor 402 in which the drain and the gate are short-circuited, namely, diode connection is performed. When the combinatorial logic circuits 200 operate and current flows from the CMOS inverter 202 to the ground, voltage is generated in the gate electrode 403 of the NMOS transistor 402 of the signal transition detection circuit 400. That is, the signal transition detection circuit 400 converts the current into the voltage. The voltage is output as the detection signal 30.

On the other hand, the enable signal generation circuit 500 has a CMOS inverter 502, an inverter 504 connected to the output thereof, and a transistor 506 connected between the CMOS inverter 502 and the ground. The detection signal 30 from the signal transition detection circuit 400 is received by the CMOS inverter 502, and when the clock 10 becomes at a high level, the transistor 506 becomes ON, and therefore, the detection signal 30 is amplified through the inverter 504 to output the enable signal 40. That is, the enable signal 40 is made to rise based on AND of the detection signal 30 and the clock 10.

Here, in this specific example, the signal transition detection circuit 400 detects the operation current of the combinatorial logic circuits 200. In this case, the detection of the current is performed for one or some logic circuit(s) from the last-stage logic circuit (CMOS inverter 202), rather than carried out for the all of the logic circuits (CMOS inverters 202) composing the combinatorial logic circuits 200. For example, the detection of the operation current is carried out for approximately 10% stage number of logic gates of all the logic gates of the entire combinatorial logic circuits 200. At least, current measurement is performed for the last-stage logic gate directly connected to the flipflop 300 with correction function. The NMOS transistor 506 receiving the clock 10 is inserted so that the CMOS inverter 502 operates only when the clock 10 rises.

In this specific example, the current measurement by the signal transition detection circuit 400 is carried out by the current flowing from the combinatorial logic circuits 200 to the ground, but the current flowing from the power source to the combinatorial logic circuits 200 can also measured, and the combination of the both is also possible. In the case of measuring the current flowing from the power source to the logic circuits 200, a PMOS transistor can be used.

Moreover, as the current measurement circuit provided in the signal transition detection circuit 400, it is sufficient that the voltage is generated when the current flows. Therefore, in addition of the transistor in which the diode connection is performed as illustrated in FIG. 9, a resistance element made of polysilicon or substrate, or a transistor in which the gate voltage or the substrate voltage is adjusted from another power source, can also be used.

It is desirable that the width of the NMOS transistor or the PMOS transistor used for the current measurement in the signal transition detection circuit 400 is the same as or larger than the total of widths of the NMOS transistors or the PMOS transistors that are made to be common in the combinatorial logic circuits 200 connected thereto. This can reduce overhead to the operation of the combinatorial logic circuit 200.

Moreover, as the input circuit of the enable signal generation circuit 500, in addition of the complementary type CMOS inverter 502 of the PMOS transistor and the NMOS transistor, an NMOS transistor and a resistance can be used when the current from the combinatorial logic circuits 200 to the ground is used, and also a PMOS transistor and a resistance can be used when the current form the power source to the combinatorial logic circuits 200 is used. In both of the cases, it is sufficient that the change of voltage value output from the signal transition detection circuit 400 is made to cover the operable input voltage range in which GAIN of the input circuit of the enable signal generation circuit 500 can be obtained.

On the other hand, for the clock 10 input into the enable signal generation circuit 500, a PMOS transistor may be inserted between the power source and the PMOS transistor and inversion signal of the clock 10 may be input into the gate thereof.

Moreover, in the specific example shown in FIG. 9, the flipflop 300 with correction function corresponds to the case of the rising edge operation, and therefore, the clock signal is input into the NMOS transistor. By contrast, when the flipflop 300 with correction function corresponds to the negative-going edge operation, there are such methods as inputting the inversion signal of the clock 10 into the NMOS transistor, or as inserting a PMOS transistor between the power source and the CMOS inverter 502 and inputting the clock 10 into the PMOS transistor thereof.

In this example, the logic circuits are designed so that the data to be taken in the next clock cycle do not arrive while the clock is High. Alternatively, the number of gates of the combinatorial logic circuits 200 to be a target that is subjected to current measurement in the signal transition detection circuit 400 is adjusted.

Figure 10:
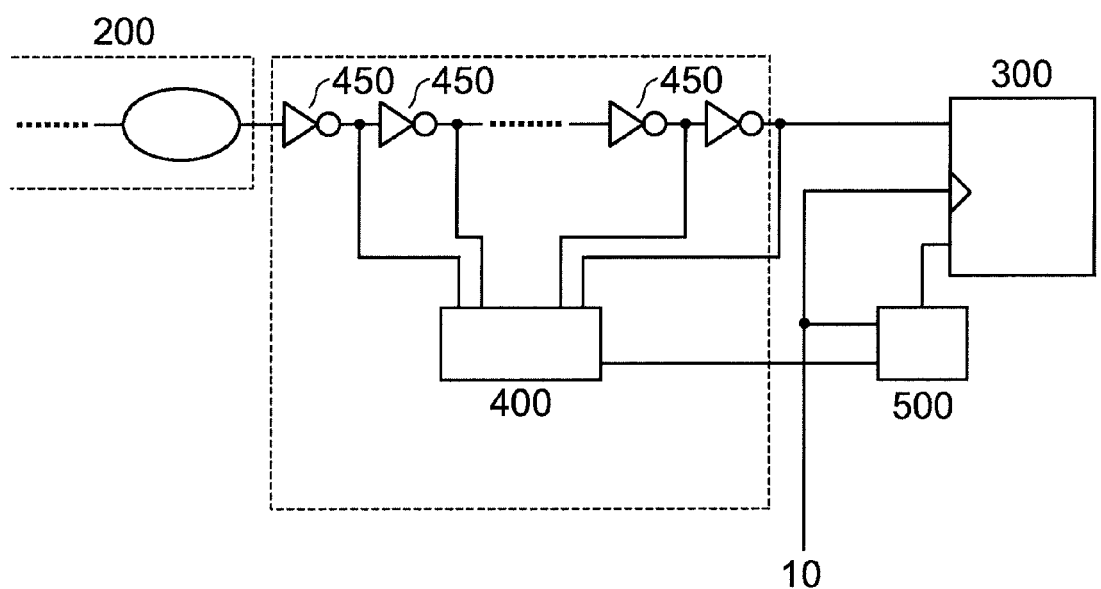
FIG. 10 is a schematic view showing another specific example of the generation method of the enable signal 40.

FIG. 10 is a schematic view showing another specific example of the generation method of the enable signal 40.

In this specific example, an inverter 450 is inserted between the last-stage output terminal of the combinatorial logic circuits 200 and the flipflop 300 with correction function, and operation of the inverter 450 is monitored by the signal transition detection circuit 400. That is, from the nodes between the plurality of inverters 450 connected to the output terminal of the combinatorial logic circuits 200 and from the output terminal of the last stage thereof, each of the signals is branched to the signal transition detection circuit 400.

Figure 11:
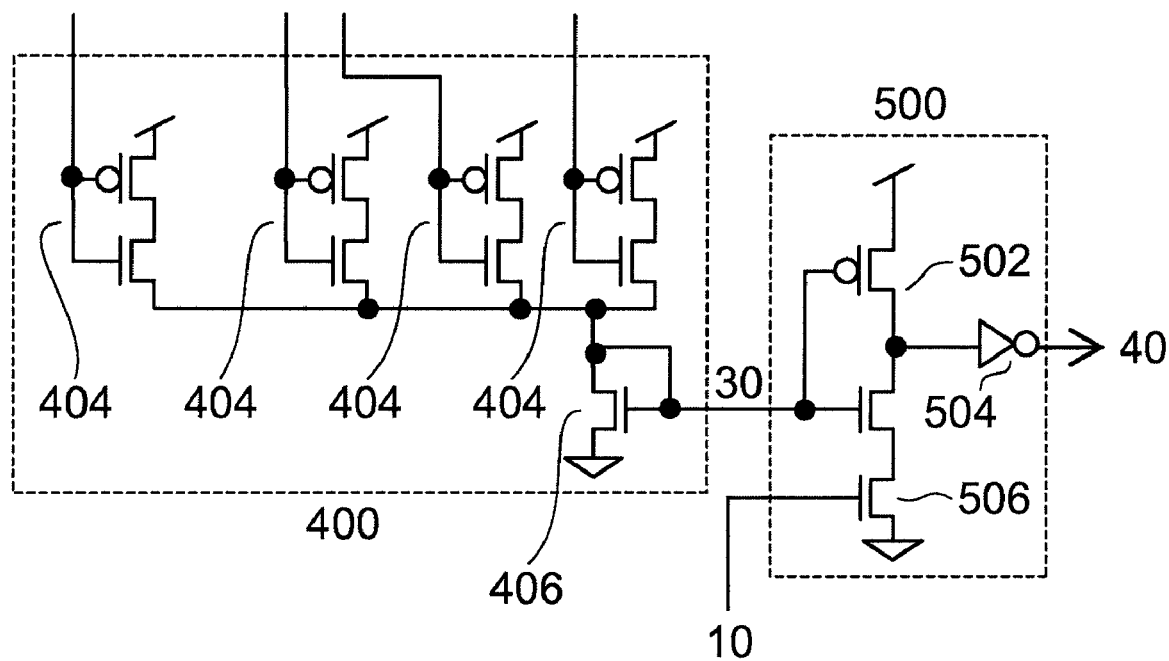
FIG. 11 is a schematic view showing a specific example of the signal transition detection circuit 400 and the enable signal generation circuit 500.

FIG. 11 is a schematic view showing a specific example of the signal transition detection circuit 400 and the enable signal generation circuit 500 that can be used in the specific example of FIG. 10.

The branched signals are input into the CMOS inverters 404 provided in the signal transition detection circuit 400, respectively. The outputs of the CMOS invertors 404 are commonly converted into voltage in the NMOS transistor 406, and output to the enable signal generation circuit 500.

In the circuit of the specific example described above for FIG. 9, voltage used for the combinatorial logic circuits 200 effectively lowers compared to the case of no signal transition detection circuit 400, and therefore, operation of the combinatorial logic circuits 200 becomes slightly slow. By contrast, in this specific, instead of directly measuring the operation current of the combinatorial logic circuits 200, the signals are branched from some nodes in the circuit including the inverters 450 and the current flowing the branch destination circuit (CMOS inverter 404) is measured. Thereby, overhead to the operation speed of the combinatorial logic circuit 200 can be reduced.

Here, it is desirable that the branch of the signal in the circuit including the inverters 450 is performed for one or a few node(s) from the last-stage inverter 450, rather than for all of the nodes. For example, it is sufficient that for approximately 10% node number of all the nodes of the combinatorial logic circuits 200, the branch is performed and the signal is taken out. It is desirable that the signal is branched to the signal transition detection circuit 400 for the node in which the calculation signal 20 is output.

In the signal transition detection circuit 400, which is the branch destination of the signal, it is sufficient that the current can be measured, and therefore, the transistor size may be small. Therefore, lowering of execution speed by making the branch can be suppressed to be minimum.

The signal transition detection circuit 400 has a CMOS inverter 404 in FIG. 11, but a discretional circuit can be applied thereto. The circuits receiving the branched signals from the respective nodes are not necessarily different from each other, but a circuit in which a plurality of nodes are assembled such as a complex gate may be provided. Moreover, the number of the branches is not limited to the four. Also in this specific example, the logic circuits are designed so that the data to be taken in the next clock cycle do not arrive while the clock is High. Or, the number of branched nodes is adjusted.

In the specific example shown in FIG. 10, the number of the inserted inverters 450 is set to be an even number. According to such structure, a part of the combinatorial logic circuits 200 is not necessarily modified, and by newly adding a circuit, the signal transition can be detected.

Moreover, in this specific example, when the added inverter 450 and the flipflop 300 with correction function are seen as a unit, this can be thought to be the flipflop 300 with correction function to which a few circuits are added. As the flipflop, the setup time becomes slightly long, but when such a flipflop 300 with correction function that preliminarily has the circuit detecting timing error is designed separately, the used flipflop can be exchanged to realize this specific example and is advantageous in the point that the logic circuits are not necessarily modified.

Figure 12:
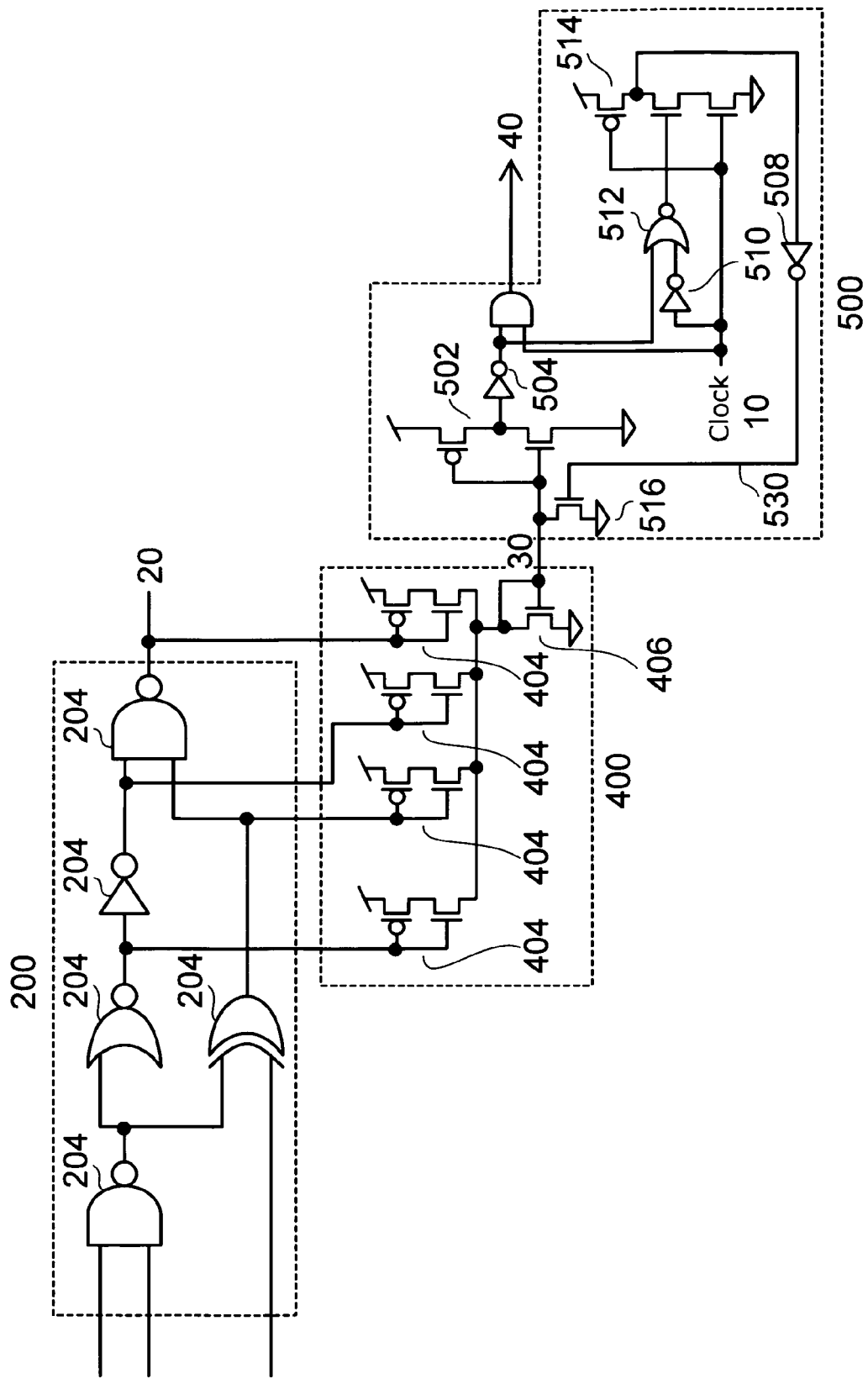
FIG. 12 is a schematic view showing another specific example of combination of the combinatorial logic circuits 200, the signal transition detection circuit 400 and the enable signal generation circuit 500.

FIG. 12 is a schematic view showing another specific example of combination of the combinatorial logic circuits 200, the signal transition detection circuit 400 and the enable signal generation circuit 500.

In the example shown in FIG. 12, a plurality of logic gates 204 are provided at the part of the final stage of the combinatorial logic circuits 200. With regard to the example shown in FIG. 20, the same signs are appended to the same components as shown in a previously presented figures and detailed explanation thereof will be appropriately omitted.

In the embodiment, after the calculation output 20 including a timing error is corrected, next calculation output 20 may arrive at the flipflop 300 when the clock 10 is in a high state. In order to cope with such a situation, the example shown in FIG. 12 includes a feedback circuit including inverter 510, NOR circuit 512, inverters 514 and 508. Once the enable signal 40 is generated, the operation of the signal transition detection circuit 400 is disabled so that the enable signal 40 is not outputted until the next clock during the clock is in a high state.

That is, in the example shown in FIG. 12, a pull-down NMOS transistor 516 is connected to the input of the enable signal generation circuit 500, and the output from the feedback circuit including inverter 510, NOR circuit 512, inverters 514 and 508 is fed back to the NMOS transistor 516. Once the enable signal 40 is outputted, the feedback is performed. As a result, the NMOS transistor 516 becomes ON, the detection signal 30 is disabled, and thus the enable signal generation circuit 500 does not operate.

In this case, the branch of the signal from the combinatorial logic circuits 200 for the current measurement by the signal transition detection circuit 400 may be made at many nodes in the combinatorial logic circuits 200 as long as the next correct calculation result do not arrive at an objective circuit by the signal transition detection circuit 400 when the clock 10 rises. In other words, the branch of the signal in the combinatorial logic circuits 200 may not be made at a node right after the output of the flipflop 100 and the following nodes of a couple of logic gates because the circuits may operate when the clock rises even if a correct signal is provided.

In the example shown in FIG. 12, the signal transition detection circuit 400 which receives signals that are branched from the combinatorial logic circuits 200 is not limited to the inverters. Also, the inverter 502 of the enable signal generation circuit 500 for receiving the detection signal 30 from the signal transition detection circuit 400 may alternatively be a circuit which includes a PMOS transistor as a resistor and a NMOS transistor which receives the detection signal 30. In such a case, the output of the circuit is amplified by the inverter 504, and the amplified signal may be used for the input signal of AND gate which generates the enable signal 40 for the flipflop 300.

The feedback circuit including inverter 510, NOR circuit 512, inverters 514 and 508 is a dynamic circuit which performs a pre-charge and an evaluation by the clock 10. The feedback signal 530 is generated by operating the feedback circuit when the clock become high and the enable signal generation circuit 500 generates a low level signal. In the example shown in FIG. 12, the inverter 510 and the NOR circuit 512 are provided, however, instead of these components, any alternative components which performs a similar logic operation may be used. If the above-mentioned conditions are met, the feedback signal 530 becomes in a high state through the inverters 514 and 508, and the detection signal 30 from the signal transition detection circuit is disabled until the clock becomes in a low state.

In the example shown in FIG. 12, the flipflop 300 is a flipflop operating at a rising edge, which operates when the clock rises. Instead, in a case where a flipflop operating at a negative-going edge, the signal transition detection circuit 400 the enable signal generation circuit 500 can be realized by rewiring the feedback circuit including inverter 510, NOR circuit 512, inverters 514 and 508 operate when the clock is in a low state.

In a case where the current measurement is performed by measuring the current flowing between a power supply and the circuit, the detection signal 30 can be similarly disabled by replacing the NMOS transistor 516 with a PMOS transistor so that the feedback signal 530 becomes in a low state when the conditions are met.

The combinatorial logic circuits 200 and the logic gates 204 shown in FIG. 12 are just a example, and the embodiment includes any other combinatorial logic circuits and logic gates.

By the way, if the timing error of the calculation output 20 from the combinatorial logic circuits 200 is calibrated by the flipflop 300 with correction function, the correct data is sent to the next stage with delayed from the clock timing, and therefore, the time used for the next calculation becomes short. This can also be sufficiently in time according to type of the calculation or combination of the data, but for making the reliability higher, it is possible to make the clock timing disagree when the error calibration is performed.

Figure 13:
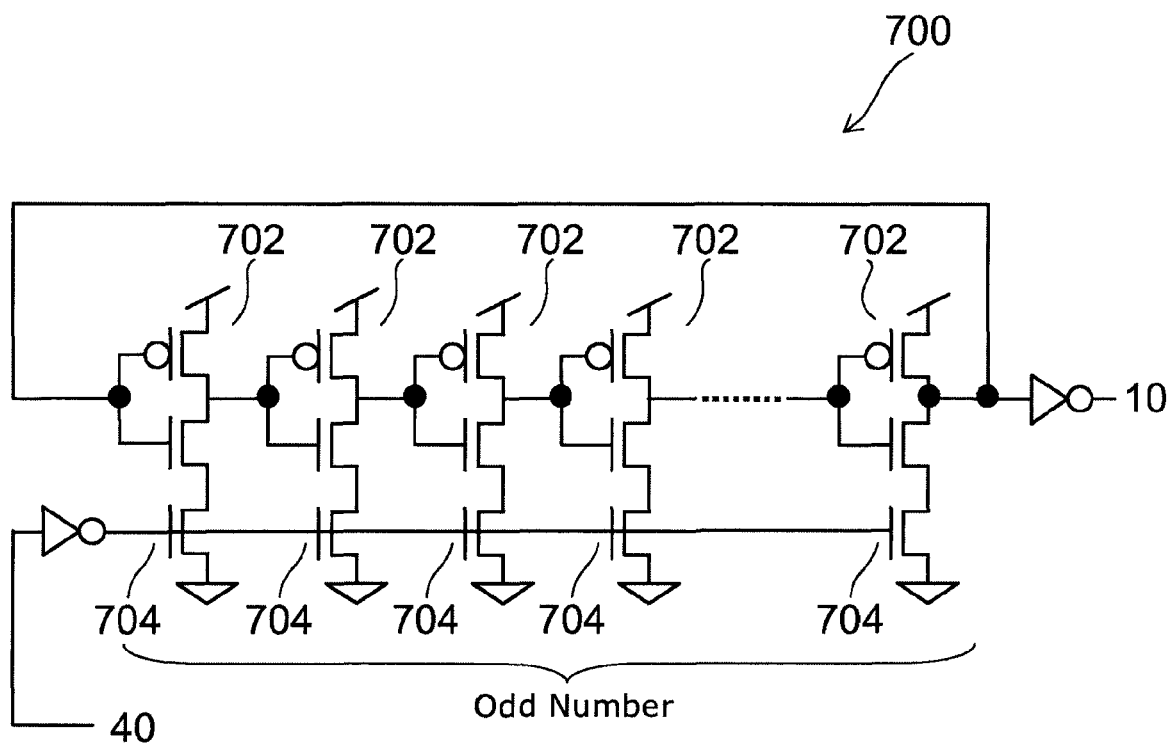
FIG. 13 is a schematic view showing a specific example of clock generation circuit.

FIG. 13 is a schematic view showing a specific example of clock generation circuit for realizing this.

Here, most simply, the specific example in which a ring oscillator using a odd number of inverters 702 is shown. An NMOS transistor 704 is inserted between each of the NMOS transistors of the ring oscillator and the ground, and the gate of the NMOS transistor 704 is connected to the inversion signal of the enable signal 40. When the enable signal 40 does not rise, all the power-source control transistors 704 are ON, and therefore, the ring oscillator performs oscillation operation. When the enable signal 40 rises, the power-source control transistor 704 becomes OFF, and therefore, the power source comes not to be supplied to the ring oscillator, and operation of the ring oscillator stops during rising of the enable signal 40. Then, when the enable signal 40 is cancelled, the ring oscillation starts again. Because the time of rising of the enable signal 40 is short, the state of inside node of the ring oscillator is held by capacitance of the transistor or wiring, and when the enable signal 40 is cancelled, the oscillation starts from the previous state again. That is, the clock timing can be delayed by the time of the enable signal 40.

Such operation can be carried out by inserting a PMOS transistor, which is not shown, between the PMOS transistor of the inverter 702 and the power-source voltage and inputting the same phase signal as the enable signal 40, it is also possible to combine this circuit and the circuit shown in FIG. 13. Moreover, the method for blocking the power-source voltage as described above can be naturally applied not only to this example of the ring oscillator of the inverter but also to a more complex clock generation circuit using VCO or PLL as long as using a power source.

As described above, according to this embodiment, calibration operation can be certainly performed when timing error is caused, and reliability of the circuit system can be improved.

As described above, with reference to the specific examples, the embodiment of this invention has been explained. However, this invention is not limited to these specific examples. For example, the specific structures of each of components composing the semiconductor integrated circuits are included in the scope of this invention as long as this invention can be carried out in the same manner by appropriately selecting the structures from a known range by those skilled in the art and the same effect can be obtained.

Moreover, combination of two or more components of the specific examples in the technically possible range is also included in the scope of the invention as long as including the substance of the invention.

In addition, all semiconductor integrated circuits that can be carried out by those skilled in the art with appropriately modifying the designs based on the above-described semiconductor integrated circuits as described above as the embodiments of the invention also belong to the scope of the invention as long as including the substance of the invention.

In addition, in the category of idea of the invention, it is understood that various modified examples and revised examples thereof that can be achieved by those skilled in the art also belong to the scope of the invention.

The invention claimed is:

1. A semiconductor integrated circuit comprising a flipflop holding and outputting input data according to a clock, the flipflop having:
   an input end to which data is input;
   an output end from which data is output;
   a first logic gate connected between the input end and the output end, the first logic gate operating according to the clock;
   a second logic gate connected between the first logic gate and the output end, the second logic gate operating according to the clock; and
   a buffer circuit,
   an input of the buffer circuit being connected to a node between the first logic gate and the input end,
   an output of the buffer circuit being connected to a node in an output side of the first logic gate, and
   the buffer circuit transitioning according to an enable signal from a high impedance state to a state in which a signal can be transmitted.

2. The integrated circuit according to claim 1, wherein the first logic gate is a first latch circuit,
   the second logic gate is a second latch circuit, and
   the output of the buffer circuit is connected between the first latch circuit and the second latch circuit.

3. The integrated circuit according to claim 1, wherein the first and the second logic gates are included in a first latch circuit which is included in the flipflop,
   the flipflop further having a second latch circuit connected between the first latch circuit and the output end, the input of the buffer circuit is connected to an input of the first latch circuit, and the output of the buffer circuit is connected to a node between the first logic gate and the second logic gate.

4. The integrated circuit according to claim 1, the flipflop further having an inverter connected between the input end and the first logic gate, the inverter and the first and the second logic gates being included in a first latch circuit which is included in the flipflop,
   the flipflop further having a second latch circuit connected between the first latch circuit and the output end, wherein
   the input of the buffer circuit is connected between the inverter and the first logic gate, and
   the output of the buffer circuit is connected to a node between the first logic gate and the second logic gate.

5. The integrated circuit according to claim 1, wherein the enable signal is synchronized with the clock and supplied periodically.

6. The integrated circuit according to claim 1, wherein the enable signal is supplied according to a signal transition of data input to the flipflop.

7. The integrated circuit according to claim 6, further comprising a logic circuit outputting the data to the flipflop,
   the enable signal being supplied according to current flowing at least between the logic circuit and a power source or between the logic circuit and a ground.

8. The integrated circuit according to claim 1, further comprising a logic circuit outputting the data to the flipflop,
   the enable signal being supplied when the clock rises and when current flowing between the logic circuit and a power source and/or between the logic circuit and a ground is detected.

9. The integrated circuit according to claim 8, wherein the supply of the enable signal is stopped when the current substantially vanishes.

10. The integrated circuit according to claim 1, further comprising:
    a logic circuit outputting the data; and
    a plurality of inverters serially connected between the logic circuit and the flipflop, the enable signal being supplied according to transition of a signal in at least any one connection midpoint of the plurality of inverters.

11. The integrated circuit according to claim 10, wherein the enable signal is supplied when the clock rises and when the signal is high.

12. The integrated circuit according to claim 1, further comprising a clock generation circuit which delays the clock by a time of a supply of the enable signal.

13. The integrated circuit according to claim 12, wherein the clock generation circuit includes an oscillating circuit which oscillates when the enable signal is not supplied and stops the oscillation when the enable signal is supplied.

14. A semiconductor integrated circuit comprising a flipflop holding and outputting input data according to a clock, the flipflop including:
   a first latch circuit connected to an input of the flipflop and having a logic gate which operates according to the clock;
   a second latch circuit connected between the first latch circuit and an output of the flipflop; and
   a buffer circuit,
   an input of the buffer circuit being connected to a node in an input side of the logic gate,
   an output of the buffer circuit being connected to a node in an output side of the logic gate, and
   the buffer circuit transitioning according to an enable signal from a high impedance state to a state in which a signal can be transmitted.

15. The integrated circuit according to claim 14, wherein the enable signal is synchronized with the clock and supplied periodically.

16. The integrated circuit according to claim 14, wherein the enable signal is supplied according to a signal transition of data input to the flipflop.

17. The integrated circuit according to claim 16, further comprising a logic circuit outputting the data to the flipflop,
   the enable signal being supplied according to current flowing at least between the logic circuit and a power source or between the logic circuit and a ground.

18. The integrated circuit according to claim 14, further comprising a logic circuit outputting the data to the flipflop,
   the enable signal being supplied when the clock rises and when current flowing between the logic circuit and a power source and/or between the logic circuit and a ground is detected.

19. The integrated circuit according to claim 14, further comprising:
   a logic circuit outputting the data to the flipflop; and
   a plurality of inverters serially connected between the logic circuit and the flipflop,
   the enable signal being supplied according to transition of a signal in at least any one connection midpoint of the plurality of inverters.

20. The integrated circuit according to claim 14, further comprising a clock generation circuit which delays the clock by a time of a supply of the enable signal.

* * * * *